(12) United States Patent
Yamada

(10) Patent No.: US 7,961,013 B2
(45) Date of Patent: Jun. 14, 2011

(54) INVERTER CIRCUIT

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 81 days.

(21) Appl. No.: 12/293,701

(22) PCT Filed: Jan. 8, 2008

(86) PCT No.: PCT/JP2008/000004
§ 371 (c)(1),
(2), (4) Date: Sep. 19, 2008

(87) PCT Pub. No.: WO2008/093487
PCT Pub. Date: Aug. 7, 2008

(65) Prior Publication Data
US 2010/0102856 A1   Apr. 29, 2010

(30) Foreign Application Priority Data
Jan. 30, 2007   (JP) .................................. 2007-019983

(51) Int. Cl.
*H03B 1/00* (2006.01)
(52) U.S. Cl. ......................... 327/108; 327/112; 327/333
(58) Field of Classification Search .................. 327/108, 327/109, 112, 333; 326/68, 80–83
See application file for complete search history.

(56) References Cited

U.S. PATENT DOCUMENTS 7,126,389 B1 * 10/2006 McRae et al. .................. 327/112
7,304,878 B2 * 12/2007 Gosmain et al. ................ 365/96
7,606,058 B2 * 10/2009 Gosmain et al. ................ 365/96

FOREIGN PATENT DOCUMENTS

| JP | 58-145232 | 8/1983 |
| JP | 05-198755 | 8/1993 |
| JP | 10-190435 | 7/1998 |
| JP | 2001-251176 | 9/2001 |

OTHER PUBLICATIONS

International Search Report issued in International Application No. PC/JP2008/000004 dated on Apr. 3, 2008.
International Preliminary Report on Patentability and Written Opinion of the International Searching Authority issued in International Patent Application No. PCT/JP2008/000004, dated Aug. 4, 2009.

\* cited by examiner

*Primary Examiner* — Long Nguyen
(74) *Attorney, Agent, or Firm* — McDermott Will & Emery LLP

(57) ABSTRACT

A first switch receives an input signal. A second switch receives the input signal, in parallel with the first switch. An output potential sensing inverter detects the potential of an output signal derived from a connection point of the first switch and the second switch. Upon receipt of an output of the output potential sensing inverter, an input switch controls whether the input signal is inputted to the second switch or not. When the potential of the output signal exceeds a predetermined threshold voltage, the output potential sensing inverter performs control such that the input switch be turned off.

8 Claims, 5 Drawing Sheets

PRIOR ART

100

INVERTER CIRCUIT

CROSS-REFERENCE TO RELATED APPLICATIONS

This application is based upon International Application No. PCT/JP2008/000004, filed Jan. 8, 2008 and claims the benefit of priority from the prior Japanese Patent Application No. 2007-019983, filed Jan. 30, 2007, the entire contents of which are incorporated herein by reference.

BACKGROUND OF THE INVENTION

1. Field of the Invention

The present invention relates to an inverter circuit for generating a clock signal and the like.

2. Description of the Related Art

A reduction in power consumption is required for an LSI (Large Scale Integration) mounted on battery-operated equipment represented by mobile devices. 20% to 45% of electric power consumed within the LSI is consumed as power for the charging and discharging of capacitances by clock signals. Thus, the reduction in power consumed by the charging and discharging will be effective in the reduction of power consumption of LSI.

The power consumed by the charging and discharging by the clock signals is proportional to the square of power supply voltage. Thus, in order to reduce the power consumed by the switching of the clock signal, a method for reducing the amplitude of clock signal has been proposed.

As shown in FIG. 1, a diode 13 is inserted between a P-channel MOS transistor 1 and an output signal line 12, whereas a diode 14 is inserted between an N-channel MOS transistor and the output signal line 12, thereby adjusting the potential of the output signal line 12 to a low amplitude.

In the above-described circuit, the amplitude level of the output signal is dependent on a forward voltage Vf of the diode. The forward voltage Vf of the diode is determined by a work function difference. Thus, it is difficult to adjust the amplitude level to an arbitrary potential. Also, when the power supply voltage is a low voltage, which is lower than approximately 1.8 V, for instance, it is also difficult to generate from a given voltage a potential lower than the given voltage.

SUMMARY OF THE INVENTION

An inverter circuit according to one embodiment of the present invention comprises: a first switch of N channel and a second switch of P channel which receive an input signal in parallel; a sensing circuit which detects the potential of an output signal derived from a connection point of the first switch and the second switch; and an input switch which controls, upon receipt of an output of the sensing circuit, whether or not the input signal is inputted to either one of the first switch and the second switch. The sensing circuit performs control such that the input switch is turned off when the potential of the output signal exceeds a predetermined threshold voltage.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

Figure 1:
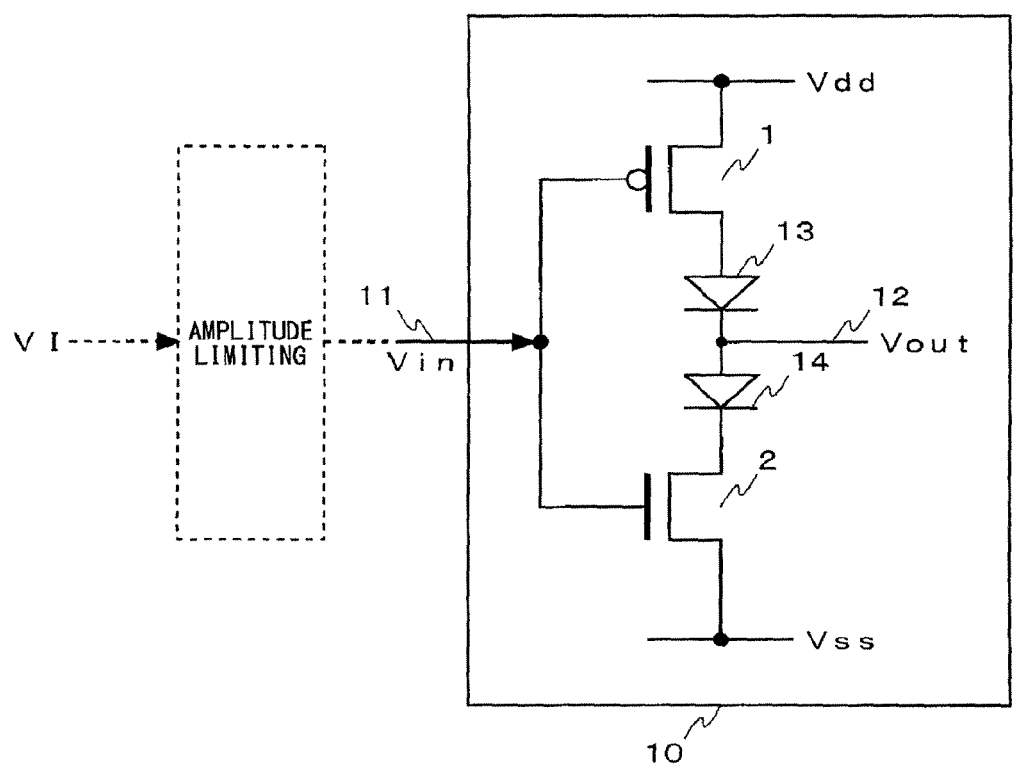
FIG. 1 is a circuit diagram showing a structure of an inverter circuit according to a conventional technique.

M1 First switch, M2 Second switch, M3 Input switch, M4 First compensation switch, M5 Second compensation switch, M6 First sensing switch, M7 First load switch, M8 Second sensing switch, M9 Second load switch, 10 Input terminal, 20 Output terminal, 30 Output potential sensing inverter, 100 Inverter circuit, 110 Inverter circuit.

DETAILED DESCRIPTION OF THE INVENTION

The invention will now be described by reference to the preferred embodiments. This does not intend to limit the scope of the present invention, but to exemplify the invention.

A description of a typical embodiment will be given before a detailed description of the present invention.

An inverter circuit according to one embodiment of the present invention comprises: a first switch of N channel and a second switch of P channel which receive an input signal in parallel; a sensing circuit which detects the potential of an output signal derived from a connection point of the first switch and the second switch; and an input switch which controls, upon receipt of an output of the sensing circuit, whether or not the input signal is inputted to either one of the first switch and the second switch. When the potential of the output signal exceeds a predetermined threshold voltage, the sensing circuit performs such control as to turn off the input switch. The "input switch" may be an N-channel transistor which receives the output of the sensing circuit at the gate terminal thereof.

According to this embodiment, the sensing circuit and the input switch are provided, and whether or not the input signal is inputted to either one of the first switch and the second switch is controlled. Thereby, the timing at which a switch for supplying the current to raise or drop the potential of the output signal is turned off can be set to a predetermined timing. As a result, the potential of the output signal can be flexibly set by a designer.

The inverter circuit may further comprise a first compensation switch which supplies, upon receipt of the output of the sensing circuit, a predetermined fixed potential to a gate terminal of the first switch or second switch connected to the input switch, in a period during which the input switch is off. Even in the state where the input switch is off and the input signal to the first switch or the second switch is cut off, the switch can be turned off in a period during which the first switch or the second switch is to be turned off.

The sensing circuit may include: a control inverter including a first sensing switch for receiving the output signal and a first load switch connected to the first sensing switch; and a compensating inverter including a second sensing switch for receiving the input signal and a second load switch connected to the second sensing switch, wherein the control inverter and the compensating inverter are connected in a complementary manner. With this, the occurrence of through current in the control inverter can be suppressed.

The inverter circuit may further comprise a second compensation switch connected to the first compensation switch in parallel therewith, wherein the first compensation switch and the second compensation switch may be controlled by at least one of an output of the control inverter and an output of the compensating inverter.

The inverter circuits may be connected in a plurality of stages, and to inverters of at least a second stage and subsequent stages, input signals each with a low amplitude of a voltage lower than a power supply voltage of said inverters are inputted. An output signal which is in-phase with an input signal may be outputted by connecting the inverters in an even number of stages.

Arbitrary combinations of the aforementioned constituting elements, and the implementation of the present invention in the form of a method, an apparatus and so forth may also be effective as the embodiments of the present invention.

Referring to the Figures, the invention will be described hereinbelow based on the following preferred embodiments. The same or equivalent components, members and processings shown in Figures are given the identical reference numerals and the repeated description thereof will be omitted as appropriate. The following embodiments do not intend to limit the scope of the present invention but exemplify the invention, and all of the features and the combinations thereof described in the embodiments are not necessarily essential to the invention.

Figure 2:
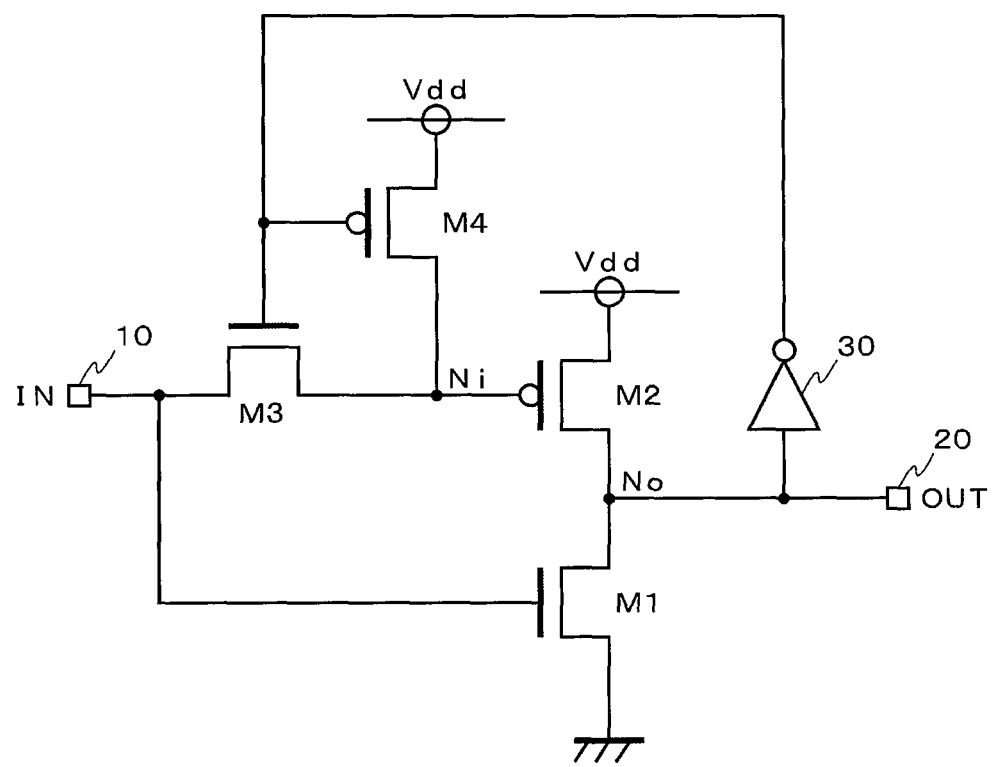
FIG. 2 is a circuit diagram showing a structure of an inverter circuit according to a first embodiment.

FIG. 2 is a circuit diagram showing a structure of an inverter circuit 100 according to a first embodiment.

The inverter circuit 100 includes an input terminal 10, to which an input signal IN is inputted, as an input-output terminal, and an output terminal 20 from which an output signal OUT is outputted. A description is given hereunder of an example where the input signal IN is a full-amplitude clock and the output signal OUT is a low-amplitude clock. It is assumed that the full-amplitude clock is designed such that the low level is a ground potential and the high level is a power supply potential Vdd. It is also assumed that the low-amplitude clock is designed such that the low level is the ground potential and the high level is about half of the power supply potential Vdd. That is, the inverter circuit 100 functions as a low-amplitude clock generation circuit.

The inverter circuit 100 includes a first switch M1 and a second switch M2. The first switch M1 is configured by an N-channel MOSFET (Metal Oxide Semiconductor Field Effect Transistor), whereas the second switch M2 is configured by a P-channel MOSFET. The first switch M1 and the second switch M2 constitute a push-pull circuit that turns on and off, in a complementary manner, in response to the input signal IN. The potential of an output node No between the first switch M1 and the second switch M2 is the output signal OUT of the inverter circuit 100.

A first fixed potential (power supply potential Vdd) is applied to a source terminal of the second switch M2, whereas the input signal IN is inputted to a gate terminal thereof via an input switch M3. A second fixed potential (ground potential) is applied to a source terminal of the first switch M1, whereas the input signal IN is inputted to a gate thereof. A drain terminal of the first switch M1 is connected to a drain terminal of the second switch M2.

The input switch M3 is configured by an N-channel MOSFET. Either one of a source terminal and a drain terminal of the input switch M3 is connected to the input terminal 10, whereas the other of the source terminal or the drain terminal thereof is connected to the gate terminal of the second switch M2. This gate terminal receives the output level of an output potential sensing inverter 30 discussed later. The input switch M3 functions as a switch to perform control of whether the input signal IN is to be inputted to the gate terminal of the second switch M2.

The output potential sensing inverter 30 detects the level of the output signal OUT. More specifically, it detects the potential of the output node No and inverts the level of the output signal OUT if the detected potential exceeds a predetermined threshold voltage Vt*. As a result, this threshold voltage Vt* is a logical threshold value. Presupposed in the present embodiment is that this threshold voltage Vt* is set to a potential which is a half of the first fixed potential (power supply potential Vdd) or a potential slightly lower than said potential. Note that the designer can set a high-level potential of the output signal OUT to a desired potential by adjusting this threshold voltage Vt*.

A first compensation switch M4 is configured by a P-channel MOSFET. The first fixed potential (power supply potential Vdd) is applied to a source terminal of the first compensation switch M4, and an output level of the output potential sensing inverter 30 is inputted to a gate terminal thereof. A drain terminal of the first compensation switch M4 is connected to a signal line that connects the gate terminal of the second switch M2 to the input switch M3.

A description is hereinbelow given of an operation of the inverter circuit according to the present embodiment. As an initial state it is assumed that the input signal IN is in a high level; a high level is applied to the gate terminal of the first switch M1; and the output signal OUT is in a low level. Hence, the output potential sensing inverter 30 outputs a high level where a low level of the output signal OUT has been inverted. Accordingly, the first compensation switch M4 turns off, whereas the input switch M3 turns on. Since the input switch M3 is in an ON state, a high level of the input signal IN is applied to the gate terminal of the second switch M2.

As the input signal IN transits to a low level from this state, the first switch M1 turns off and a low level is inputted to the gate terminal of the second switch M2, thus turning the second switch M2 on. As a result, the potential of the output node No begins to rise. When the potential of the output node No rises to the above-mentioned threshold voltage Vt* of the output potential sensing inverter 30, the output of the output potential sensing inverter 30 transits from a high level to a low level.

As the output of the output potential sensing inverter 30 transits to a low level, the input switch M3 turns off and the first compensation switch M4 turns on. As a result, the gate terminal of the second switch M2 is cut off from the input terminal 10, and the first fixed potential (power supply potential Vdd) is applied via the first compensation switch M4. When the potential of the gate terminal of the second switch M2 rises to a threshold voltage of the second switch M2, the second switch M2 turns off. When the second switch M2 turns off, the charging to the output node No stops and the potential of the output signal OUT also stops rising. Thereafter, as the input signal IN transits to a high level from a low level, the first switch M1 turns on and the potential of the output node No begins to drop. Eventually the output signal OUT goes to low. When the potential of the output node No falls below the above-mentioned threshold voltage Vt* of the output potential sensing inverter 30, the output of the output potential sensing inverter 30 transits from a low level to a high level, thereby turning the input switch M3 on.

In this manner, according to the present embodiment, the timing at which the rise in potential of the output signal OUT is stopped can be set by the setting value of the above-mentioned threshold voltage Vt* of the output potential sensing inverter 30. Thus, the high level of the output signal OUT can be set to a predetermined potential and the amplitude level of the output signal OUT can be flexibly set.

When the input signal IN is in a transitional state from a low level to a high level, the second switch M2 turns off due to the fact that the first compensation switch M4 turns on. Hence, the state where both the first switch M1 and the second switch M2 turn on at the same time can be prevented. As a result, no through current flows through the first switch M1 and the second switch M2, so that the power consumption can be reduced.

Figure 3:
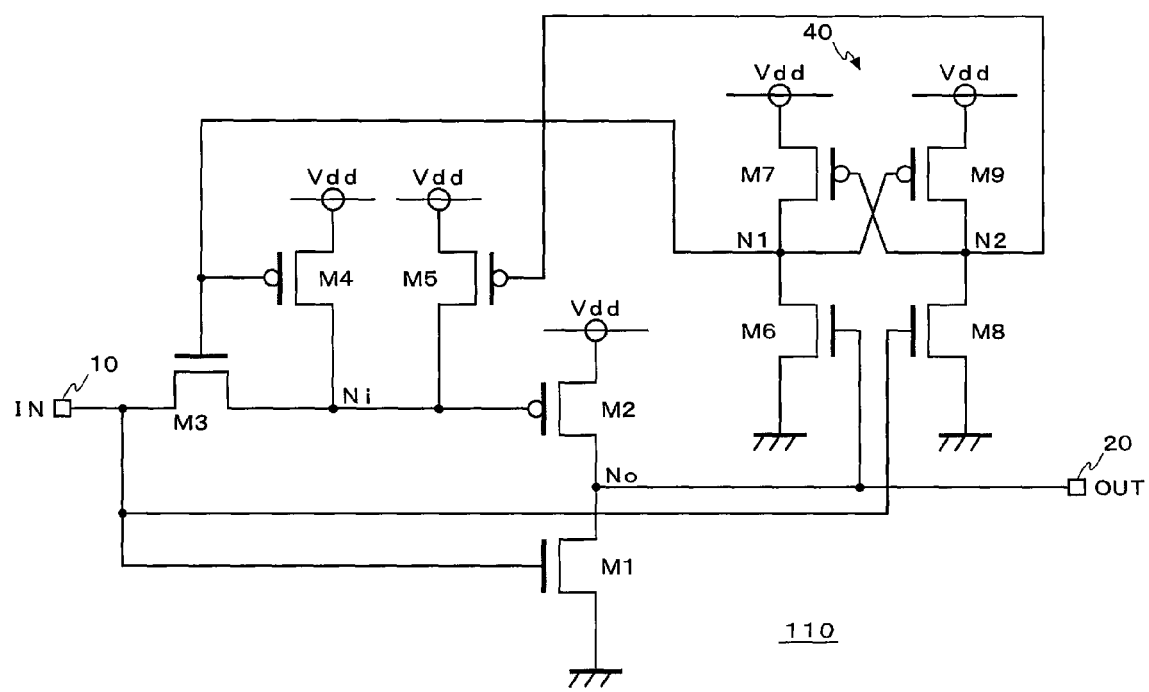
FIG. 3 is a circuit diagram showing a structure of an inverter circuit according to a second embodiment.

FIG. 3 is a circuit diagram showing a structure of an inverter circuit 110 according to a second embodiment. Compared with the inverter circuit 100 according to the first embodiment, the structure of the inverter circuit 110 according to the second embodiment is such that a level shifter circuit 40 is provided in place of the output potential sensing inverter 30 and a second compensation switch M5 is added.

The level shifter circuit 40 includes a first sensing switch M6, a first load switch M7, a second sensing switch M8, and a second load switch M9. The first sensing switch M6 is constituted by an N-channel MOSFET, whereas the first load switch M7 is constituted by a P-channel MOSFET. A second fixed potential (ground potential) is applied to a source terminal of the first sensing switch M6, whereas an output signal OUT is inputted to a gate terminal thereof. A drain terminal of the first sensing switch M6 is connected to a drain terminal of the first load switch M7. A first fixed potential (power supply potential Vdd) is applied to a source terminal of the first load switch M7, whereas the potential of a second node N2 between the second sensing switch M8 and the second load switch M9 is applied to a gate terminal thereof. The potential of the second node N2 is an output signal of a compensating inverter which is configured by the second sensing switch M8 and the second load switch M9.

The first sensing switch M6 and the first load switch M7 are equivalent to the output potential sensing inverter 30 according to the first embodiment. The potential of a first node N1 between the drain terminal of the first sensing switch M6 and the drain terminal of the first load switch M7 is an output signal of a control inverter which is configured by the first sensing switch M6 and the first load switch M7. The driving capability of the first sensing switch M6 and the first load switch M7 is set in a manner such that the level of the output signal of the control inverter is inverted when the potential of the output signal OUT of this inverter circuit 110 reaches the above-mentioned threshold voltage Vt*.

The second sensing switch M8 is constituted by an N-channel MOSFET, whereas the second load switch M9 is constituted by a P-channel MOSFET. The second fixed potential (ground potential) is applied to a source terminal of the second sensing switch M8, whereas an input signal IN is inputted to a gate terminal thereof. A drain terminal of the second sensing switch M8 is connected to a drain terminal of the second load switch M9. The first fixed potential (power supply potential Vdd) is applied to a source terminal of the second load switch M9, whereas the potential of the first node N1 between the first sensing switch M6 and the first load switch M7 is applied to a gate terminal thereof. The driving capability of the second sensing switch M8 and the second load switch M9 is set in a manner such that the potential of the first node N1 and the potential of the second node N2 are opposite in phase and identical in amplitude.

When the amplitude of the output signal OUT is less than that of the input signal IN, the amplitude level inputted to the first sensing switch M6 differs from that to the second sensing switch M8. Hence, an adjustment needs to be made in a manner such that the driving capability of the second sensing switch M8 is smaller than that of the first sensing switch M6.

As will be described later, when the amplitude of the input signal IN is the same as that of the output signal OUT, the amplitude level inputted to the gate terminal of the first sensing switch M6 is also the same as that to the gate terminal of the second sensing switch M8. Hence, the driving capability of the second sensing switch M8 and that of the first sensing switch M6 are set equal to each other. The driving capabilities of the second load switch M9 and the first load switch M7 are adjusted according to those of the second sensing switch M8 and the first sensing switch M6, respectively.

A second compensation switch M5 is constituted by a P-channel MOSFET. The first fixed potential (power supply potential Vdd) is applied to a source terminal of the second compensation switch M5, whereas the potential of the second node N2 is inputted to a gate terminal thereof. A drain terminal of the second compensation switch M5 is connected to a signal line connecting a gate terminal of a second switch M2 to an input switch M3. At this time, the driving capability of the second compensation switch M5 is smaller than that of the input switch M3.

Figure 4:
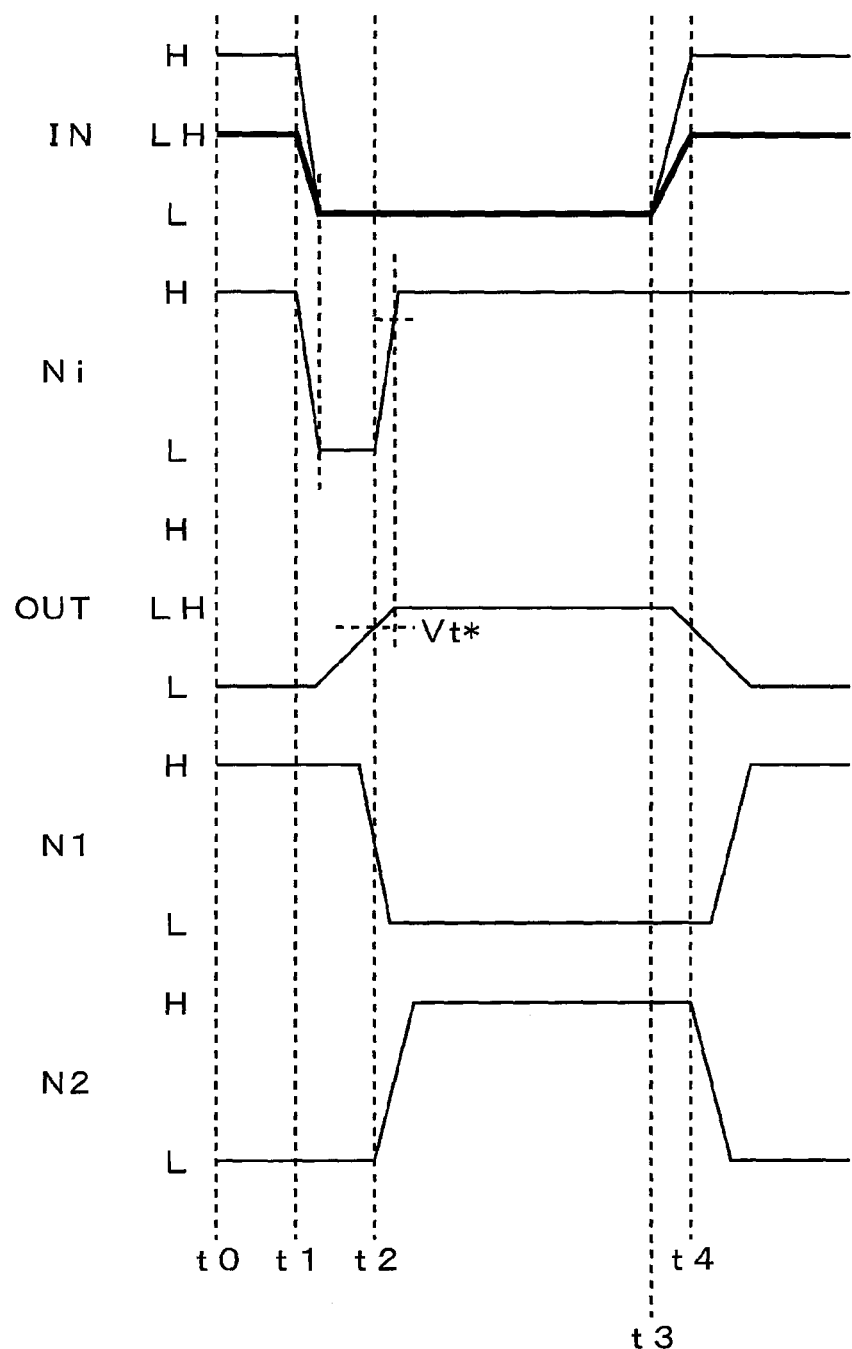
FIG. 4 is a timing chart to explain an operation of an inverter circuit according to a second embodiment.

FIG. 4 is a timing chart to explain an operation of the inverter circuit 110 according to the second embodiment. Assume that an initial state is denoted by to, the input signal IN is in a high level, and a high level is applied to the gate terminal of the first switch M1. In this state, the output signal OUT is in a low level; the output of the first node N1 is in a high level; and the output of the second node N2 is in a low level. The second compensation switch M5 is in an ON state. Hence, the input node Ni is in the power supply potential Vdd level, namely a full-range high level, even though the input signal IN is in a high level LH (indicated by a thick line in FIG. 4) of a low-amplitude clock signal.

At time t1, the input signal IN begins to fall toward a low level, and turns off when the gate level of the first switch M1 exceeds the threshold voltage. Also, the potential of the input node Ni begins to fall from a high level to a low level via the input switch M3. As a result, the gate terminal of the second switch M2 goes low and the second switch M2 turns on. Thus the output signal OUT begins to rise from a low level to a high level. When at time t2 the potential of the output signal OUT reaches the above-mentioned threshold voltage Vt* of the controlling inverter, the first node N1 becomes a low level from the high level. Also, the second node N2 becomes a high level from the low level. Subsequently, the input switch M3 turns off in response to the level of the first node N1, and at the same time the first compensation switch M4 conducts gradually. And when the gate level of the second switch M2 exceeds the threshold voltage, the second switch M2 turns off. As a result, the charging to the output node No stops and the potential of the output signal OUT stops rising, too.

It is preferred that the designer sets the above-mentioned threshold voltage Vt* in consideration of delay time from when the potential of the first node N1 begins to fall from the high level to the low level until the potential of the output signal OUT stops rising.

When at time t3 the input signal IN begins to rise from the low level to a high level, the first switch M1 conducts gradually and the output signal OUT begins to fall from the high level LH to a low level. At time t4, the second node N2 begins to fall from the high level to a low level as the gate level of the second sensing switch M8 goes high. At the same time, the first node N1 begins to rise from the low level to a high level. Then the potential of the output node No is all discharged, at which time the output signal OUT goes low.

As described above, by employing the second embodiment, the following effect is achieved in addition to the effect of the first embodiment. In the first embodiment, when the input level of the output potential sensing inverter 30 lies near the above-mentioned threshold voltage Vt*, the through current may occur.

To cope with this, in the second embodiment the compensating inverter constituted by the second sensing switch M8 and the second load switch M9 that operate in the opposite phase is provided in addition to the control inverter constituted by the first sensing switch M6 and the first load switch M7. Thus the occurrence of the through current in the control inverter for detecting the potential of the output signal OUT can be suppressed.

The above-described embodiments are merely exemplary and it will be obvious to those skilled in the art that various modifications to constituting elements and processes could be developed and that such modifications are also within the scope of the present invention.

For example, the P channel and N channel of the constituting transistor may be reversed in polarity, so that it is possible to generate a low-amplitude clock wherein the high level of the output signal is the power supply voltage while the low level thereof is a potential higher than the ground voltage.

Figure 5:
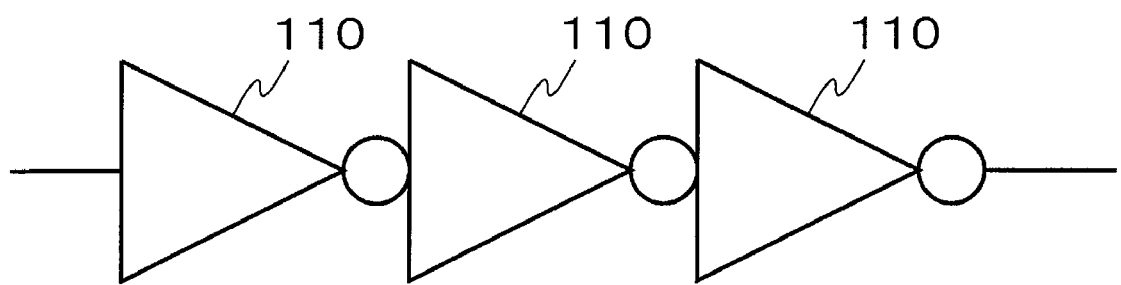
FIG. 5 is a circuit diagram showing a plurality of the inverter circuits of the second embodiments are connected in a plurality of stages.

A plurality of stages of inverter circuits such as the inverter circuits 100 and 110 described in the embodiments may be connected. If an even number of stages are connected, the input signal and the output signal are in phase. If a plurality of stages of inverter circuits 110 according to the second embodiment are connected as shown in FIG. 5, the input signal IN of the initial stage will have a full amplitude and the input signals IN from the second stage onward will be have low amplitudes. Hence, the high levels of amplitudes inputted to the gate terminals of the first sensing switch M6 and the second sensing switch M8 at the second stage and subsequent stages are all aligned. As a result, the driving capability of the first sensing switch M6 is set equal to that of the second sensing switch M8, and the driving capability of the first load switch M7 is set equal to that of the second load switch M9. In this manner, if the inverter circuits according to the embodiments are connected in a plurality of stages thereof, an arbitrary buffer circuit or level shift circuit can be configured. If, for example, the driving capability or the number of stages is arbitrarily set, the response speed or phase can be arbitrarily adjusted.

Also, though MOSFETs are used in the embodiments, bipolar transistors may be used. In such a case, the current needs to be supplied to a base.

What is claimed is:

1. An inverter circuit, comprising:
    a first transistor of N channel and a second transistor of P channel which receive an input signal in parallel;
        a level shifter which detects the potential of an output signal derived from a connection point of said first transistor and said second transistor; and
        a third transistor which controls, upon receipt of an output of said level shifter, whether or not the input signal is inputted to either one of said first transistor and said second transistor, wherein
    said level shifter includes:
        a control inverter including a sixth transistor for receiving the output signal and a seventh transistor connected to a drain terminal of the sixth transistor; and
        a compensating inverter including an eighth transistor for receiving the input signal at the gate terminal and a ninth transistor connected to a drain terminal of the eighth transistor, and
    the control inverter and the compensating inverter are connected in a complementary manner.

2. An inverter circuit according to claim 1, further comprising a fourth transistor which supplies, upon receipt of the output of said level shifter, a predetermined fixed potential to a gate terminal of said first transistor or second transistor connected to said third transistor, in a period during which said third transistor is off.

3. An inverter circuit according to claim 1, further comprising a fifth transistor connected to the fourth transistor in parallel therewith,
    wherein said fourth transistor and said fifth transistor are controlled by at least one of an output of the control inverter and an output of the compensating inverter.

4. An inverter circuit according to claim 2, further comprising a fifth transistor connected to the fourth transistor in parallel therewith,
    wherein said fourth transistor and said fifth transistor are controlled by at least one of an output of the control inverter and an output of the compensating inverter.

5. An inverter circuit according to claim 1, wherein the inverter circuits are connected in a plurality of stages, and
    to inverters of at least a second stage and subsequent stages, input signals each with a low amplitude of a voltage lower than a power supply voltage of said inverters are inputted.

6. An inverter circuit according to claim 2, wherein the inverter circuits are connected in a plurality of stages, and
    to inverters of at least a second stage and subsequent stages, input signals each with a low amplitude of a voltage lower than a power supply voltage of said inverters are inputted.

7. An inverter circuit according to claim 3, wherein the inverter circuits are connected in a plurality of stages, and
    to inverters of at least a second stage and subsequent stages, input signals each with a low amplitude of a voltage lower than a power supply voltage of said inverters are inputted.

8. An inverter circuit according to claim 4, wherein the inverter circuits are connected in a plurality of stages, and
    to inverters of at least a second stage and subsequent stages, input signals each with a low amplitude of a voltage lower than a power supply voltage of said inverters are inputted.

* * * * *